(12) United States Patent
Kuo et al.

(10) Patent No.: US 9,955,569 B2
(45) Date of Patent: Apr. 24, 2018

(54) MULTI-LAYER PRINTED CIRCUIT BOARDS WITH DIMENSIONAL STABILITY

(71) Applicant: ELITE MATERIAL CO., LTD., Taoyuan (TW)

(72) Inventors: Ya-Wen Kuo, Taoyuan (TW); Li-Chih Yu, Taoyuan (TW); Ching-Hsin Ho, Taoyuan (TW)

(73) Assignee: Elite Material Co., Ltd., Taoyuan County (TW)

( * ) Notice: Subject to any disclaimer, the term of this patent is extended or adjusted under 35 U.S.C. 154(b) by 0 days.

(21) Appl. No.: 15/363,556

(22) Filed: Nov. 29, 2016

(65) Prior Publication Data

US 2017/0079134 A1 Mar. 16, 2017

Related U.S. Application Data

(63) Continuation of application No. 14/558,193, filed on Dec. 2, 2014, now Pat. No. 9,545,018.

(30) Foreign Application Priority Data

Nov. 5, 2014 (TW) .............................. 103138278 A (51) Int. Cl.
| | |
|---|---|
| *H05K 1/18* | (2006.01) |
| *H05K 1/02* | (2006.01) |
| *H05K 3/46* | (2006.01) |
| *H05K 1/09* | (2006.01) |
| *H05K 1/03* | (2006.01) |

(52) U.S. Cl.
CPC ............. *H05K 1/0271* (2013.01); *H05K 1/09* (2013.01); *H05K 3/4602* (2013.01); *H05K 3/4652* (2013.01); *H05K 1/0366* (2013.01); *H05K 2201/029* (2013.01); *H05K 2201/0355* (2013.01); *H05K 2201/068* (2013.01)

(58) Field of Classification Search
CPC .. H05K 1/00; H05K 1/02; H05K 1/03; H05K 1/05; H05K 1/09; H05K 1/11; H05K 1/16; H05K 1/18; H05K 3/00; H05K 3/02; H05K 3/22; H05K 3/32; H05K 3/36; H05K 3/44; H05K 3/46; H01L 21/02; H01L 21/58
USPC ........ 174/261, 250–252, 255–258, 260, 262; 361/301.1, 306.3, 771; 442/164, 172; 29/852
See application file for complete search history.

(56) References Cited

U.S. PATENT DOCUMENTS 4,769,270 A * 9/1988 Nagamatsu ............ H05K 1/056
174/255
4,864,722 A * 9/1989 Lazzarini ............... H05K 1/024
174/256

(Continued)

*Primary Examiner* — Xiaoliang Chen
(74) *Attorney, Agent, or Firm* — Muncy, Geissler, Olds & Lowe, P.C.

(57) ABSTRACT

A multi-layer printed circuit board comprises: a core comprising a core insulation layer and traces formed on two sides of the core insulation layer; a plurality of insulation layers sequentially formed at two sides of the core; and a plurality of trace layers respectively formed between two insulation layers and on the outmost insulation layers; wherein the core insulation layer contains a resin material different from that of the insulation layers, such that the core insulation layer has a dimensional stability superior to that of the insulation layers.

13 Claims, 10 Drawing Sheets

(56) References Cited

U.S. PATENT DOCUMENTS

| | | | |
|---|---|---|---|
| 5,785,789 A * | 7/1998 | Gagnon | B32B 27/04 |
| | | | 156/230 |
| 5,928,803 A | 7/1999 | Yasuda | |
| 6,085,415 A * | 7/2000 | Gandhi | H01L 21/486 |
| | | | 156/253 |
| 6,204,559 B1 | 3/2001 | Lin | |
| 6,477,284 B1 | 11/2002 | Oda | |
| 6,534,852 B1 | 3/2003 | Lin | |
| 9,331,370 B1 * | 5/2016 | Jiang | H01P 3/081 |
| 2001/0051707 A1 * | 12/2001 | Fukuoka | C08G 73/1039 |
| | | | 528/338 |
| 2003/0146421 A1 * | 8/2003 | Wakizaka | C08G 65/485 |
| | | | 252/601 |
| 2003/0153449 A1 * | 8/2003 | Nakagawa | C03C 3/19 |
| | | | 501/35 |
| 2004/0008960 A1 | 1/2004 | Rantala | |
| 2004/0039127 A1 * | 2/2004 | Amou | C08K 3/0008 |
| | | | 525/328.9 |
| 2004/0212030 A1 * | 10/2004 | Asai | G02B 6/12002 |
| | | | 257/432 |
| 2004/0222522 A1 | 11/2004 | Homma | |
| 2004/0257749 A1 * | 12/2004 | Otsuka | H01G 2/065 |
| | | | 361/306.3 |
| 2005/0057906 A1 * | 3/2005 | Nakatani | H05K 3/321 |
| | | | 361/771 |
| 2005/0087850 A1 * | 4/2005 | Nishikawa | H01L 23/50 |
| | | | 257/678 |
| 2005/0207091 A1 * | 9/2005 | Kambe | H01L 23/498 |
| | | | 361/301.1 |
| 2005/0218503 A1 | 10/2005 | Abe | |
| 2005/0266668 A1 | 12/2005 | Sawada | |
| 2006/0012967 A1 * | 1/2006 | Asai | G02B 6/43 |
| | | | 361/764 |
| 2006/0177640 A1 | 8/2006 | Higashioji | |
| 2006/0269868 A1 | 11/2006 | Hasegawa | |
| 2007/0048815 A1 | 3/2007 | Song | |
| 2007/0066741 A1 | 3/2007 | Donovan | |
| 2007/0172605 A1 | 7/2007 | Ohtani | |
| 2007/0254245 A1 | 11/2007 | Hasegawa | |
| 2008/0036097 A1 * | 2/2008 | Ito | C08L 63/00 |
| | | | 257/778 |
| 2008/0049323 A1 | 2/2008 | Sugiyama | |
| 2008/0062355 A1 | 3/2008 | Sata | |
| 2008/0139698 A1 | 6/2008 | Nishida | |
| 2008/0254236 A1 | 10/2008 | Kawanishi | |
| 2009/0008136 A1 * | 1/2009 | Ikeguchi | H01L 23/5383 |
| | | | 174/255 |
| 2009/0110909 A1 * | 4/2009 | Innocenzo | H05K 3/4655 |
| | | | 428/323 |
| 2009/0128747 A1 | 5/2009 | Sugiyama | |
| 2009/0151984 A1 * | 6/2009 | Fujimura | C08J 5/24 |
| | | | 174/250 |
| 2009/0197437 A1 * | 8/2009 | Ouchi | H05K 3/326 |
| | | | 439/68 |
| 2009/0200073 A1 * | 8/2009 | Mano | H05K 1/162 |
| | | | 174/260 |
| 2009/0213311 A1 | 8/2009 | Hisakado | |
| 2009/0267212 A1 | 10/2009 | Wada | |
| 2010/0065314 A1 * | 3/2010 | Lin | H01L 23/49894 |
| | | | 174/258 |
| 2010/0300740 A1 | 12/2010 | Ichiyanagi | |
| 2011/0183088 A1 * | 7/2011 | Shimizu | B29D 11/00278 |
| | | | 428/32.39 |
| 2011/0284273 A1 * | 11/2011 | Japp | H05K 3/4641 |
| | | | 174/257 |
| 2012/0043123 A1 | 2/2012 | Takada | |
| 2012/0152596 A1 | 6/2012 | Yamada | |
| 2012/0174393 A1 | 7/2012 | Ikeguchi | |
| 2012/0188734 A1 * | 7/2012 | Mikado | H05K 1/185 |
| | | | 361/761 |
| 2012/0205142 A1 * | 8/2012 | Higo | H05K 1/0242 |
| | | | 174/251 |
| 2012/0217049 A1 * | 8/2012 | Hanai | H05K 1/185 |
| | | | 174/260 |
| 2013/0075140 A1 * | 3/2013 | Amano | H05K 3/4602 |
| | | | 174/257 |
| 2013/0099149 A1 * | 4/2013 | Ji | C08K 5/057 |
| | | | 252/62 |
| 2013/0281575 A1 * | 10/2013 | Ji | C09D 5/00 |
| | | | 523/455 |
| 2013/0330910 A1 | 12/2013 | Tanaka | |
| 2014/0020933 A1 * | 1/2014 | Hedin | H05K 1/0201 |
| | | | 174/252 |
| 2014/0020941 A1 * | 1/2014 | Ueda | H05K 1/0306 |
| | | | 174/258 |
| 2014/0070396 A1 * | 3/2014 | Kyozuka | H01L 24/19 |
| | | | 257/698 |
| 2014/0182897 A1 | 7/2014 | Lee | |
| 2014/0187112 A1 * | 7/2014 | Shin | H05K 1/0366 |
| | | | 442/164 |
| 2014/0187687 A1 * | 7/2014 | Ji | H05K 1/0373 |
| | | | 524/114 |
| 2014/0251656 A1 * | 9/2014 | Ikeda | H05K 3/4676 |
| | | | 174/251 |
| 2014/0291005 A1 | 10/2014 | Fukushima | |
| 2014/0356635 A1 | 12/2014 | Kim | |
| 2015/0041184 A1 | 2/2015 | Nam | |
| 2015/0044485 A1 * | 2/2015 | Wang | H05K 1/0353 |
| | | | 428/462 |
| 2016/0053554 A1 | 2/2016 | Skaugset | |
| 2016/0102783 A1 | 4/2016 | Skaugset | |

* cited by examiner

MULTI-LAYER PRINTED CIRCUIT BOARDS WITH DIMENSIONAL STABILITY

CROSS-REFERENCE TO RELATED APPLICATIONS

This application is a continuation application of U.S. application Ser. No. 14/558,193, filed Dec. 2, 2014, which claims priority of Taiwan Patent Application No. 103138278, filed on Nov. 5, 2014. All of the foregoing applications are hereby incorporated by reference in their entirety herein.

FIELD OF THE INVENTION

The present invention relates to multi-layer printed circuit boards and more particularly to multi-layer printed circuit boards with high dimensional stability and excellent signal transmission property.

BACKGROUND OF THE INVENTION

In order to meet the demands of compact, light-weight and conveniently portable electronic products, research and development of electronic product manufacturers are directed to and focused on miniaturization of electronic components.

Printed circuit boards are one of the essential components of many electronic products, such as smart phones, and served to provide electronic signal transmission among different electronic components. Several technical solutions have been proposed, such as high density interconnection (HDI), by printed circuit board manufacturers to reduce the size or thickness of printed circuit boards, so as to form denser trace connections within the same or even smaller size or thickness.

For example, the HDI technique employs several means to achieve high trace density, including laser blind hole drilling, small trace width and high performance thin type materials. The increase of density greatly improves the connections per unit area. In addition, the more advanced "any layer" HDI multi-layer printed circuit boards use micro-blind hole structures through plated hole filling and stacking to further achieve more sophisticated interlayer connections.

Generally, "any layer" HDI technique is different from the manufacturing processes of conventional printed circuit boards and primarily uses build-up methods to form the trace layers and insulation layers. Each build-up cycle involves lamination of prepregs and copper foils, laser drilling, hole metallization, and trace formation, including exposure, lithography, etching, etc. The aforesaid steps are carried out according to the number of layers, such as eight to fourteen layers for an ordinary mobile phone circuit board, needed to be formed to complete the multi-layer printed circuit boards.

Due to the high precision requirements of the HDI technique, positional change of interlayer electrical connections of buried holes and blind holes needs to be controlled during the process. If the lamination process causes severe deformation, the final products won't be able to meet the requirements and have to be discarded, which will increase the production costs.

Accordingly, there is a need to provide multi-layer printed circuit boards with high dimensional stability and excellent signal transmission property.

SUMMARY OF THE INVENTION

It is a primary object of the present invention to provide a multi-layer printed circuit board capable of preventing or inhibiting positional shift of plated holes resulted from excessive deformation of materials in the lamination process, such that poor alignment problems can be alleviated and desirable signal transmission property can be obtained.

To achieve the aforesaid and other objects, the present invention provides a multi-layer printed circuit board comprising: a core comprising a core insulation layer and traces formed on two sides of the core insulation layer; a plurality of insulation layers sequentially formed at two sides of the core; and a plurality of trace layers respectively formed between two insulation layers and on the outmost insulation layers; wherein the core insulation layer contains a resin material different from that of the insulation layers, such that the core insulation layer has a dimensional stability superior to that of the insulation layers.

The multi-layer printed circuit board is mainly characterized in that the core insulation layer contains a resin material different from that of other insulation layers and has a dimensional stability superior to that of other insulation layers; therefore, deformation caused by lamination of different layers can be reduced or inhibited, so as to prevent increased defective rate caused by non-compliant products. In addition, other (or external) insulation layers have a better electronic signal transmission property than that of the core insulation layer, such as lower dielectric constant or dielectric loss (dissipation factor), making them suitable for high frequency signal transmission.

In one embodiment, the dimensional stability may be a thermal expansion coefficient, a storage modulus, a stiffness, a glass transition temperature or a combination thereof. For example, the core insulation layer may have an X-axis or Y-axis thermal expansion coefficient of less than or equal to 12 ppm/° C., as measured according to the IPC-TM-650-2.4.24 testing standard, such as less than or equal to 10 ppm/° C.; alternatively, the core insulation layer may have a glass transition temperature (Tg) of greater than or equal to 230° C. as measured by dynamic mechanical analysis (DMA) according to the IPC-TM-650-2.4.25 testing standard; alternatively, the core insulation layer may have a stiffness of greater than or equal to 5000 N/m at about 250° C. as measured by DMA according to the IPC-TM-650-2.4.24 testing standard; alternatively, the core insulation layer may have a storage modulus of greater than or equal to 5000 MPa at about 250° C. as measured by DMA according to the IPC-TM-650-2.4.24.2 testing standard.

In one embodiment, the core insulation layer has a thermal expansion coefficient less than that of other insulation layers. For example, the core insulation layer may have a thermal expansion coefficient of less than 12 ppm/° C. and preferably less than 10 ppm/° C.

In another embodiment, other insulation layers have a dielectric constant less than that of the core insulation layer. For example, other insulation layers may have a dielectric constant of less than 3.6, as measured according to the JIS C2565 testing method.

In another embodiment, the core insulation layer has a glass transition temperature (Tg) of greater than or equal to 230° C. For example, the core insulation layer may have a glass transition temperature of 230° C., as measured by DMA, and other insulation layers may have a glass transition temperature of about 180° C., as measured by DMA, In still another embodiment, the glass transition temperature (Tg) of the core insulation layer is greater than the process temperature of a hot press machine or laminator used for laminate lamination. The glass transition temperature refers to the temperature at which phase change of the material occurs. When the process temperature of a hot press machine or laminator is greater than the glass transition temperature of the core insulation layer, the core insulation layer material is in a rubbery, soft phase which is liable to significant dimensional variation, including expansion, contraction and other deformation. Therefore, using a material in the core insulation layer which has a glass transition temperature higher than the process temperature of a hot press machine or laminator, the core insulation layer can be prevented from being in the rubbery, soft phase, thereby avoiding excessive dimensional change and variation and effectively enhancing dimensional stability.

In yet another embodiment, the core insulation layer has a storage modulus of greater than or equal to 5000 MPa. For example, the core insulation layer has a storage modulus of 5000 MPa, and other insulation layers have a storage modulus of about 4000 MPa.

In still another embodiment, the core insulation layer has a stiffness of greater than or equal to 5000 N/m. For example, the core insulation layer has a stiffness of 5000 N/m, and other insulation layers have a stiffness of about 4000 N/m.

In another embodiment, the insulation layers have a signal transmission property superior to that of the core insulation layer.

In generally, the core can be obtained by the following steps: providing a substrate, such as a glass fiber cloth, to be impregnated in a resin composition followed by baking to a semi-cured state, also known as the B-stage, the resin composition comprising but not limited to maleimide, a curing agent or a crosslinking agent, and inorganic filler, and optionally further comprising epoxy resin or cyanate ester resin; superimposing a copper foil on each of two sides of the resin composition-impregnated substrate, also known as a prepreg, and performing lamination; and forming traces from the copper foils.

In addition, the aforesaid multi-layer printed circuit board may be prepared by the following steps: providing a resin composition-impregnated substrate, such as a first prepreg, wherein the resin composition comprises without limitation maleimide, diamine crosslinking agent, such as 4,4'-oxydianiline, and silicon dioxide inorganic filler; superimposing a copper foil on each of two sides of the substrate and performing lamination; forming traces from the copper foils to form a core having a core insulation layer; repeating the following build-up steps according to the number of layers needed: laminating a second prepreg and a copper foil onto each side of the core to make the second prepreg form an external insulation layer; performing a drilling process; performing a hole metallization process; and forming traces from the copper foils; and performing surface treatment after a number of external insulation layers needed have been formed, wherein the core insulation layer has a dimensional stability superior to that of the external insulation layers, and the external insulation layers have a signal transmission property superior to that of the core insulation layer.

In one embodiment, the insulation layers of the multi-layer printed circuit board according to the present invention are formed by lamination, and the drilling process is carried out after lamination to form holes, characterized in that the deformation distance of each hole after further lamination is less than 30 micrometers, such as less than 25 micrometers.

BRIEF DESCRIPTION OF THE DRAWINGS

A more complete understanding of the subject matter can be derived by referring to the detailed description and claims when considered in conjunction with the following figures, wherein like reference numbers refer to similar elements throughout the figures.

DETAILED DESCRIPTION OF THE INVENTION

Embodiments are illustrated in the accompanying figures to improve understanding of concepts as presented herein. Skilled artisans appreciate that elements in the figures are illustrated for simplicity and clarity and have not necessarily been drawn to scale. For example, the dimensions of some of the elements in the figures may be exaggerated relative to others to facilitate understanding of the embodiments.

Since various aspects and embodiments are merely exemplary and not limiting, after reading this specification, skilled artisans appreciate that other aspects and embodiments are possible without departing from the scope of the invention. Other features and benefits of any one or more of the embodiments will be apparent from the following detailed description and the claims.

The use of "a" or "an" is employed to describe elements and components described herein. This is done merely for convenience and to give a general sense of the scope of the invention. Accordingly, this description should be read to include one or at least one and the singular also includes the plural unless it is obvious that it is meant otherwise.

As used herein, the terms "comprises," "comprising," "includes," "including," "has," "having" or any other variation thereof are intended to cover a non-exclusive inclusion. For example, a component, structure, article, or apparatus that comprises a list of elements is not necessarily limited to only those elements but may include other elements not expressly listed or inherent to such component, structure, article, or apparatus. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present).

As used herein, the terms "material" and "composition" are used interchangeably as synonyms, both referring to a composition of matter containing multiple components or ingredients.

One embodiment of the present invention provides a multi-layer printed circuit board, such as a multi-layer printed circuit board made using the HDI technique, mainly comprising a core comprising a core insulation layer and traces formed on two sides of the core insulation layer; a plurality of insulation layers sequentially formed at two sides of the core; and a plurality of trace layers respectively formed between two insulation layers and on the outmost insulation layers.

Unless expressly stated to the contrary, the number of layers of the multi-layer printed circuit board is not specifically limited; it may be an eight-layer, ten-layer, twelve-layer, fourteen-layer, or sixteen-layer board, wherein the layer number of the board is determined by the number of conductive layers (e.g. copper trace layers) in the multi-layer printed circuit board.

The aforesaid core may be prepared according to the following process: impregnating a substrate, such as a conventional glass fiber cloth 1078, into a first resin composition and then baking it to a semi-cured state (i.e. B-stage) to obtain a prepreg; cutting the prepreg according to a predefined size requirement; superimposing a piece of 0.5 oz HTE copper foil on each of two sides and carrying out lamination for three hours under vacuum, high temperature (195° C.) and high pressure (500 psi); and optionally fabricating traces, such as using exposure, lithography and etching processes, on the copper foil to obtain the core.

In one embodiment, the first resin composition may comprise maleimide, a curing agent or a crosslinking agent, and inorganic filler, and the first resin composition may be any resin composition suitable for making an insulation layer with better dimensional stability, such as a composition of maleimide and diphenylamine or bismaleimide triazine (BT) resin, which may further comprise cyanate ester resin or epoxy resin. It may also be the EM-LX composition available from Elite Material Co., Ltd. Accordingly, the core thus prepared has a core insulation layer with a better dimensional stability, such as an expansion coefficient of less than 12 ppm/° C., a storage modulus of greater than or equal to 5000 MPa at 250° C., a stiffness of greater than or equal to 5000 N/m at 250° C., and/or a glass transition temperature of greater than or equal to 230° C.

Once the core has been made, a prepreg is superimposed on each side of the core, and a 0.5 oz HTE copper foil is superimposed on each prepreg, which is then subject to a vacuum condition, high temperature (175° C.) and high pressure (360 psi) for lamination for an hour to complete the first lamination, optionally followed by the drilling process, hole metallization process and trace formation process to complete the first build-up cycle to form a four-layer board.

The prepregs used in the above-mentioned build-up cycle can be obtained by, for example, impregnating a conventional glass fiber cloth 1067 in a second resin composition and then baking it to the B-stage, wherein the second resin composition is different from the first resin composition and is a low dielectric material with a Dk less than 3.5 as measured at 2 GHz frequency. For example, the second resin composition may be the EM-355(D) composition (Dk=3.33 as measured at 2 GHz frequency) available from Elite Material Co., Ltd. Accordingly, the external insulation layers, which contain low dielectric material, formed in the build-up steps may provide a better signal transmission property.

Afterwards, a second or subsequent build-up cycle can be performed according to the need to form a printed circuit board with a predetermined number of layers. For example, a twelve-layer board can be obtained by subjecting the core to five build-up cycles. Then surface treatment and other post-processing procedures commonly used in the manufacturing process of printed circuit boards can be carried out to obtain a multi-layer printed circuit board product.

A major feature of the present invention lies in using a resin material capable of forming a product with better dimensional stability (including but not limited to X-axis or Y-axis expansion coefficient of less than or equal to 12 ppm/° C., storage modulus of greater than or equal to 5000 MPa at 250° C., stiffness of greater than or equal to 5000 N/m at 250° C., glass transition temperature of greater than or equal to 230° C., or a combination thereof) during the process to make the core to achieve a better dimensional stability, such that the circuit board has inhibited or reduced X-axis or Y-axis deformation (such as expansion or contraction) during the build-up steps, thereby improving the poor alignment and increasing the process yield rate. In addition, materials with better signal transmission property, such as low dielectric constant (Dk<3.5, as measured at 2 GHz frequency) are used to build up the external layers, such that the insulation layers formed in the build-up steps can attain high transmission speed.

In terms of signal transmission of multi-layer printed circuit boards, signals at low frequency (<1 GHz) are primarily transmitted by the trace layers (e.g. copper trace layers), and signal transmission at high frequency (>1 GHz, such as 2 GHz) is associated to the property of insulation layers (also known as dielectric layers). For example, the relationship between the transmission rate V and Dk of an insulation layer is as follows: $V=k*c/\sqrt{Dk}$, wherein V represents the signal transmission speed, c represents the speed of light, k is a constant, and Dk represents the dielectric constant. Therefore, the lower the dielectric constant of an insulation layer, the faster the transmission speed V.

A primary advantage of the present invention is using a high dimensional stability material as the core layer to increase the dimensional stability of a multi-layer board in subsequent processes and using a high signal transmission property material as other insulation layers (a.k.a. dielectric layers) to effectively increase the signal transmission speed, thereby overcoming at the same time the following three problems associated to a multi-layer printed circuit board architecture: (A) poor dimensional stability and poor signal transmission speed of multi-layer boards using ordinary FR-4 material; (B) poor dimensional stability of multi-layer boards using ordinary low Dk material; (C) low signal transmission speed of multi-layer boards using high dimensional stability material, as materials with high dimensional stability usually have higher dielectric constant, and other problems associated to high material costs, demand for higher lamination temperature and the accompanying higher lamination costs, poor thermal resistance of copper foil after brown oxidation, and poor processability for routing and trimming.

Embodiments

Figure 1:
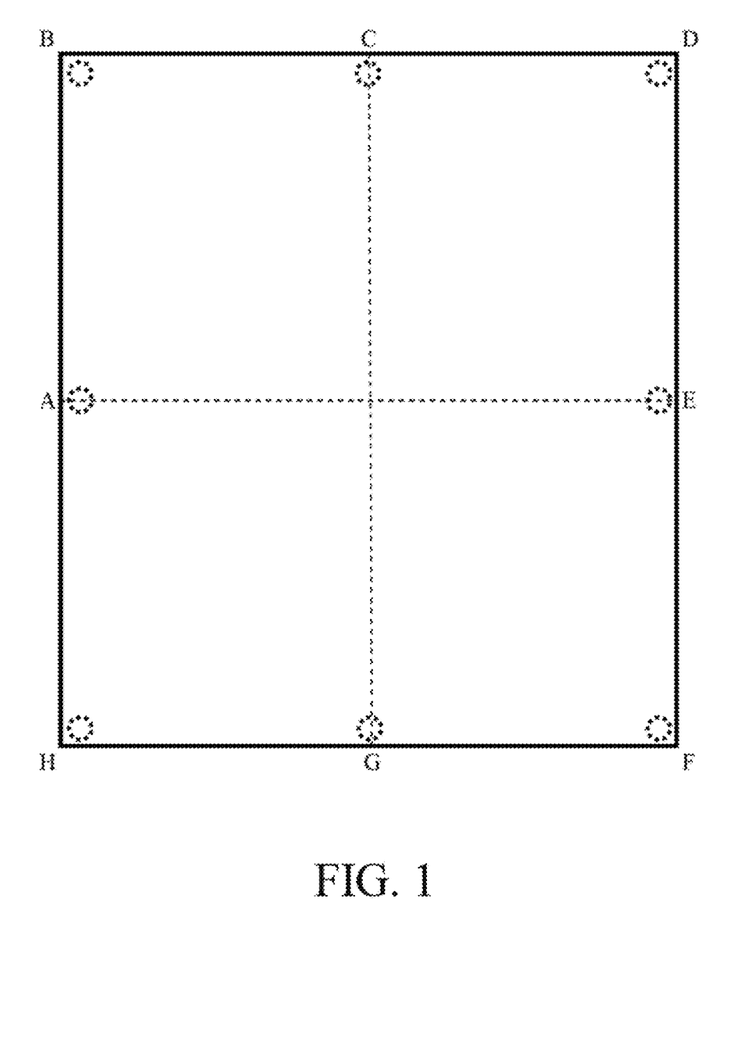
FIG. 1 illustrates the distribution of target points.

The core of Example 1 is made by the following process: preparing a first prepreg (EM-LX, available from Elite Material Co., Ltd., containing 1078 glass fiber cloth), superimposing a 0.5 oz HTE copper foil on each of two sides of the first prepreg and carrying out lamination for three hours under vacuum, high temperature (195° C.) and high pressure (500 psi) to obtain a copper-clad laminate, and fabricating traces, such as using conventional exposure, lithography and etching processes, on the copper foil to obtain the core. The traces are designed according to a Gerber artwork (24.3 inches in length (Y) and 20.3 inches in width (X)), where locations for eight target points for alignment are designed, and correspondingly eight target points are formed on the core by trace etching and used as the reference for measuring the deformation of the board in the subsequent lamination process. The distribution of target points A to H is illustrated in FIG. 1, wherein the distance between A and E is 23.2 inches, and the distance between C and G is 19.6 inches.

The build-up process for Example 1 is performed as follows: after the core has been obtained, second prepregs (EM-355(D)) are prepared; a second prepreg is superimposed on each of the two sides of the core, and a 0.5 oz HTE copper foil is further superimposed on the other side of the prepreg opposite to the core, followed by lamination for an hour under vacuum, high temperature (175° C.) and high pressure (360 psi) to complete the first lamination. Then the drilling process is performed, and a 3D measurement instrument (X-Ray) is employed to measure the target points; the shifted positions of the eight target points are measured and recorded; alignment holes are formed by drilling, followed by the hole metallization process and trace formation process to complete the first build-up cycle to form a four-layer board.

The above-mentioned build-up steps are repeated to form a six-layer board (second build-up cycle, second lamination), an eight-layer board (third build-up cycle, third lamination) until a twelve-layer board (fifth build-up cycle, fifth lamination) has been formed.

Figure 2:
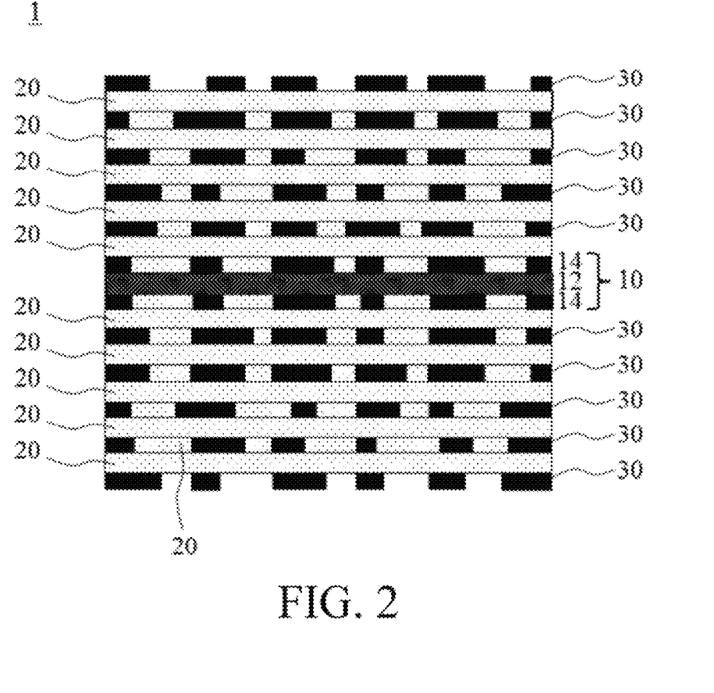
FIG. 2 illustrates a multi-layer printed circuit board according to one embodiment of the present invention.
Figure 3A:
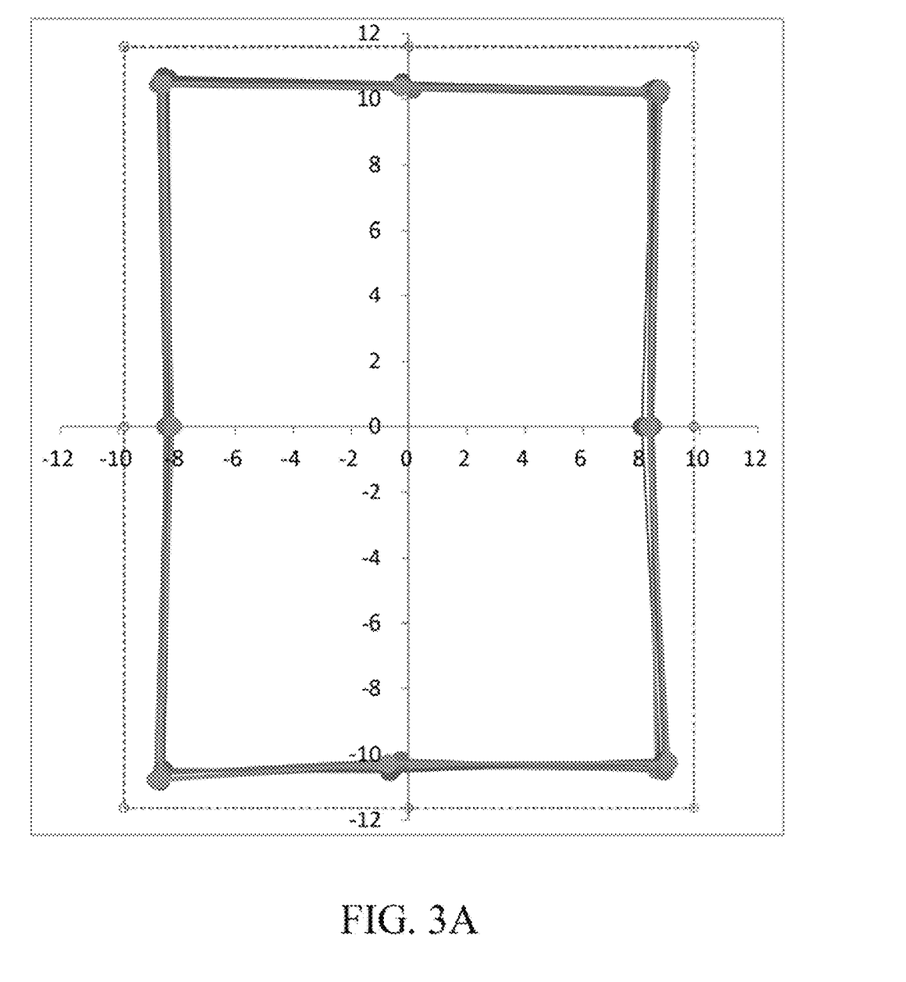
FIGS. 3A, 3B, 4A, 4B, 5A, 5B, 6A and 6B illustrate the dimensional change after build-up lamination of the core of the example and comparative examples of the present invention.
Figure 3B:
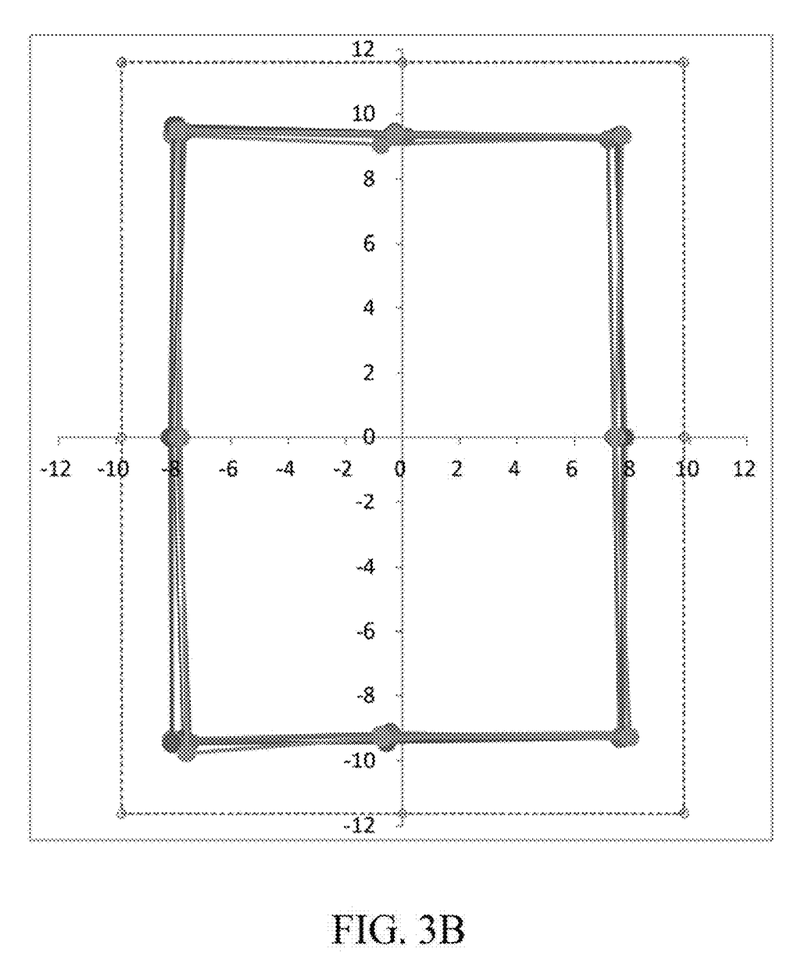
Figure 4A:
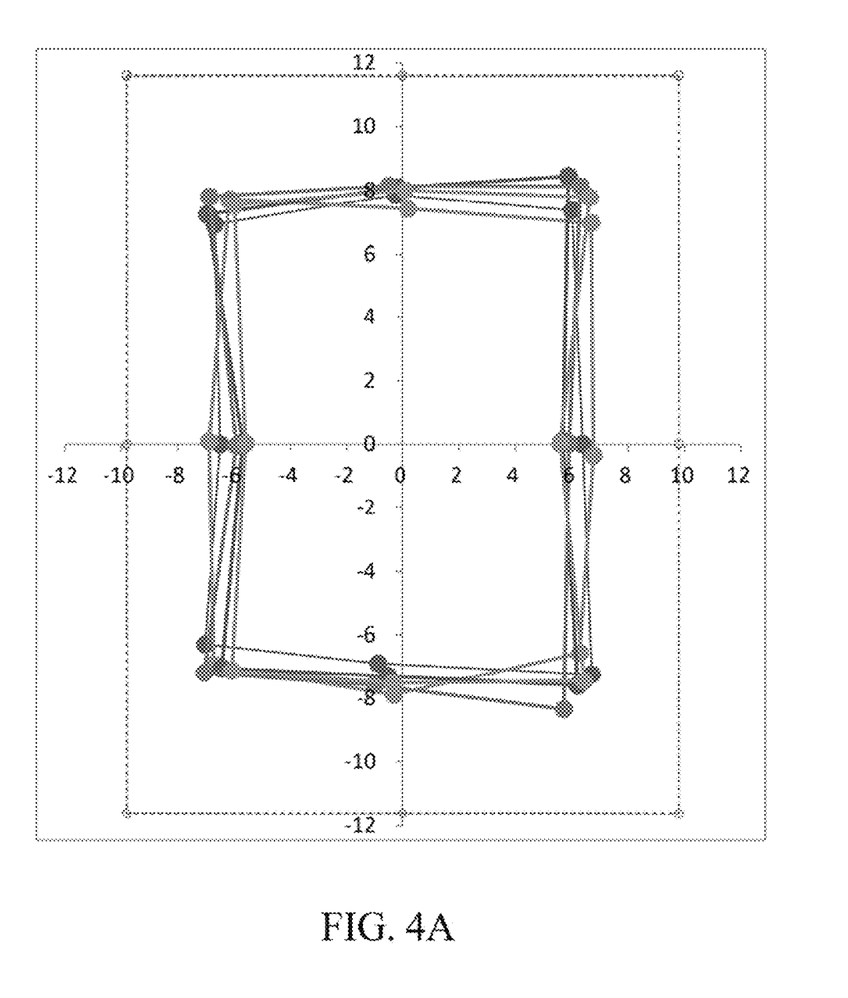
Figure 4B:
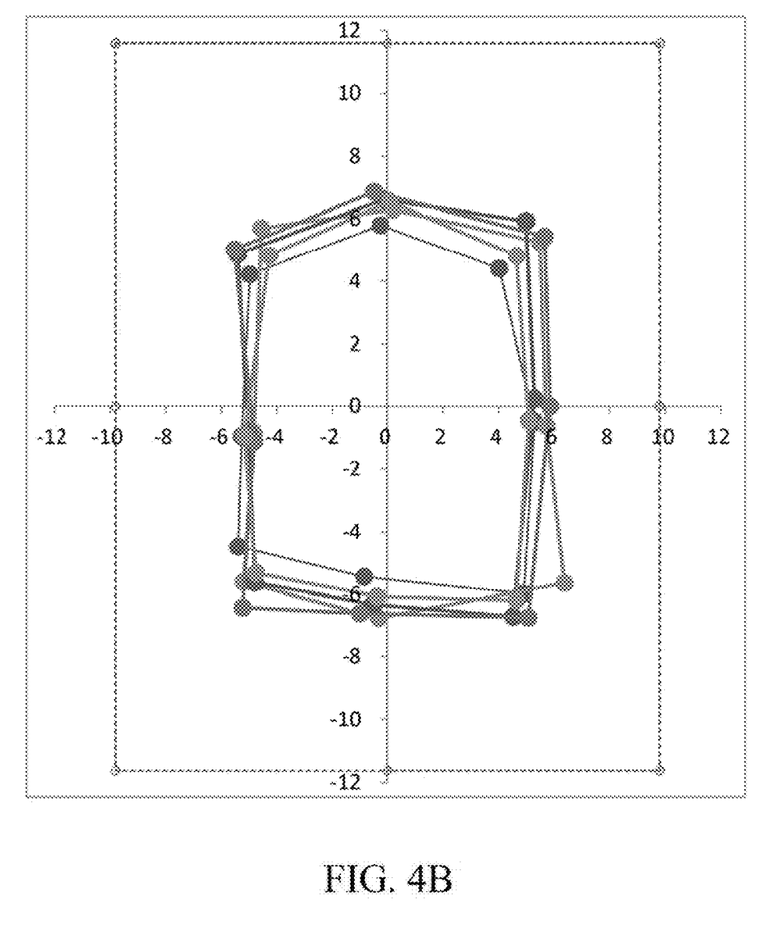
Figure 5A:
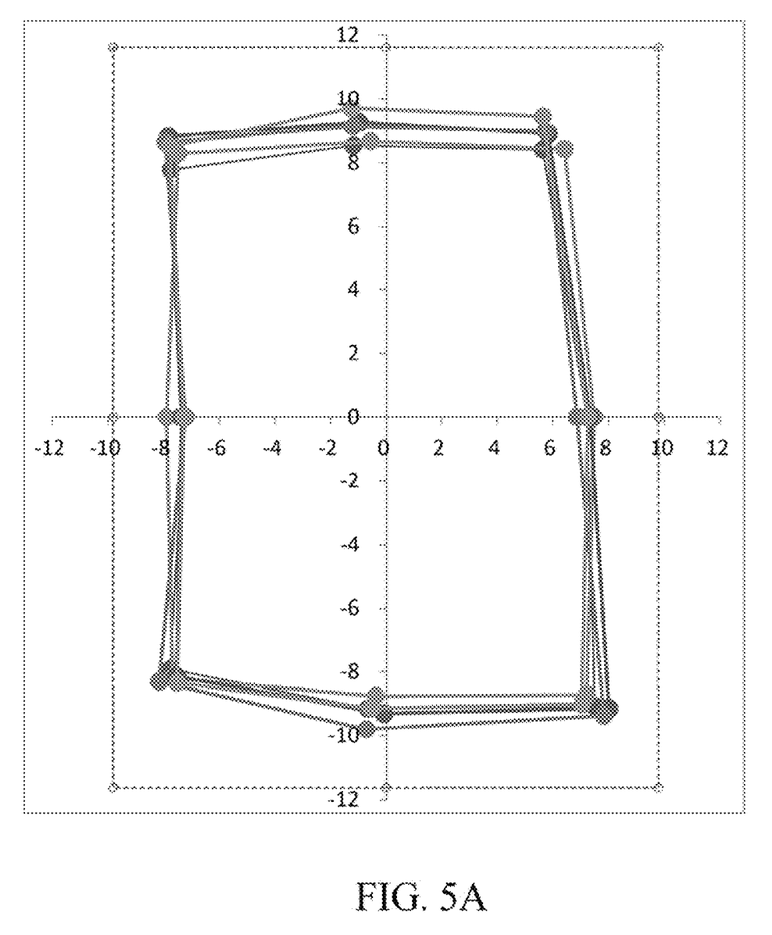
Figure 5B:
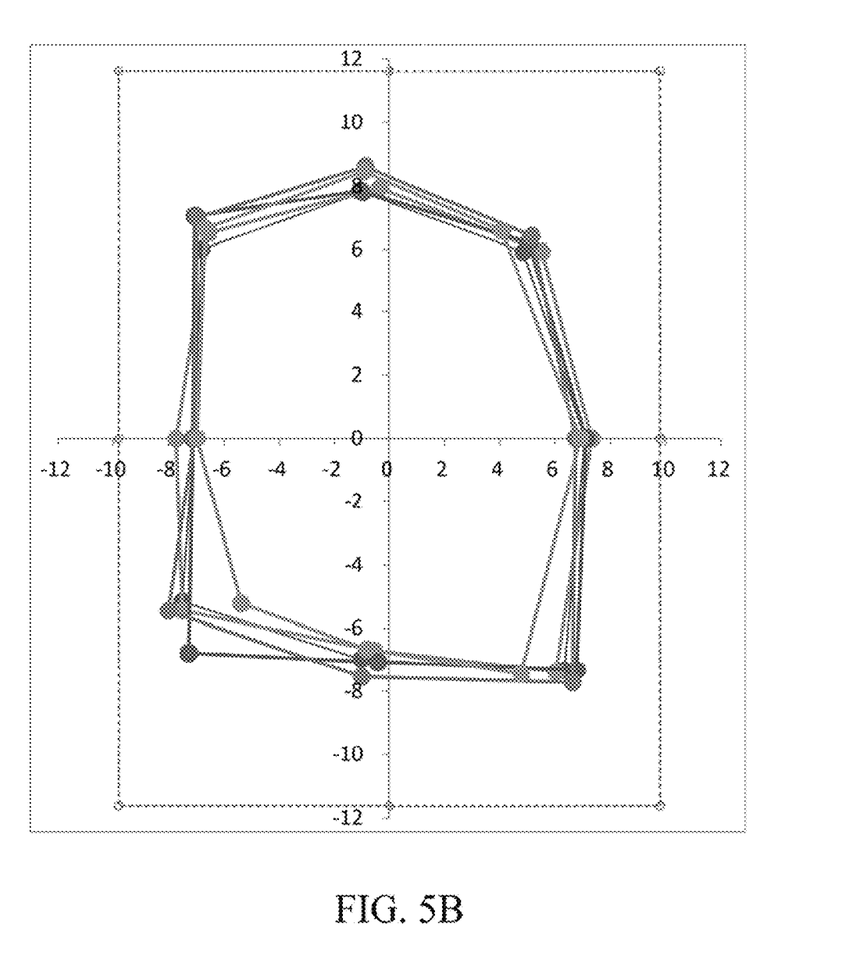
Figure 6A:
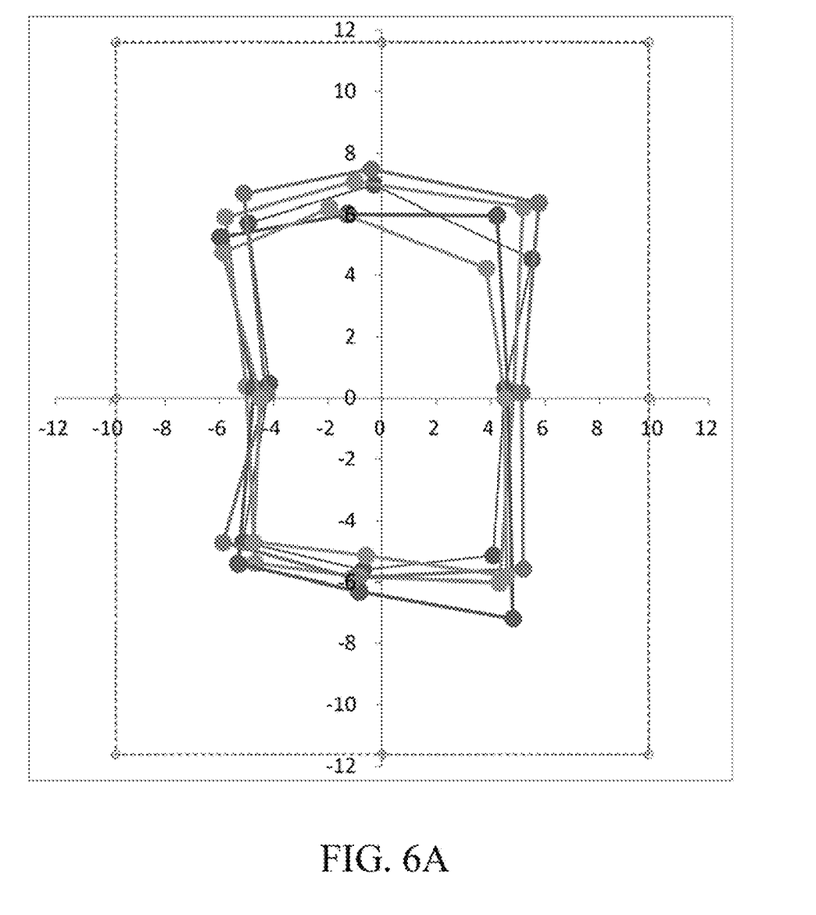
Figure 6B:
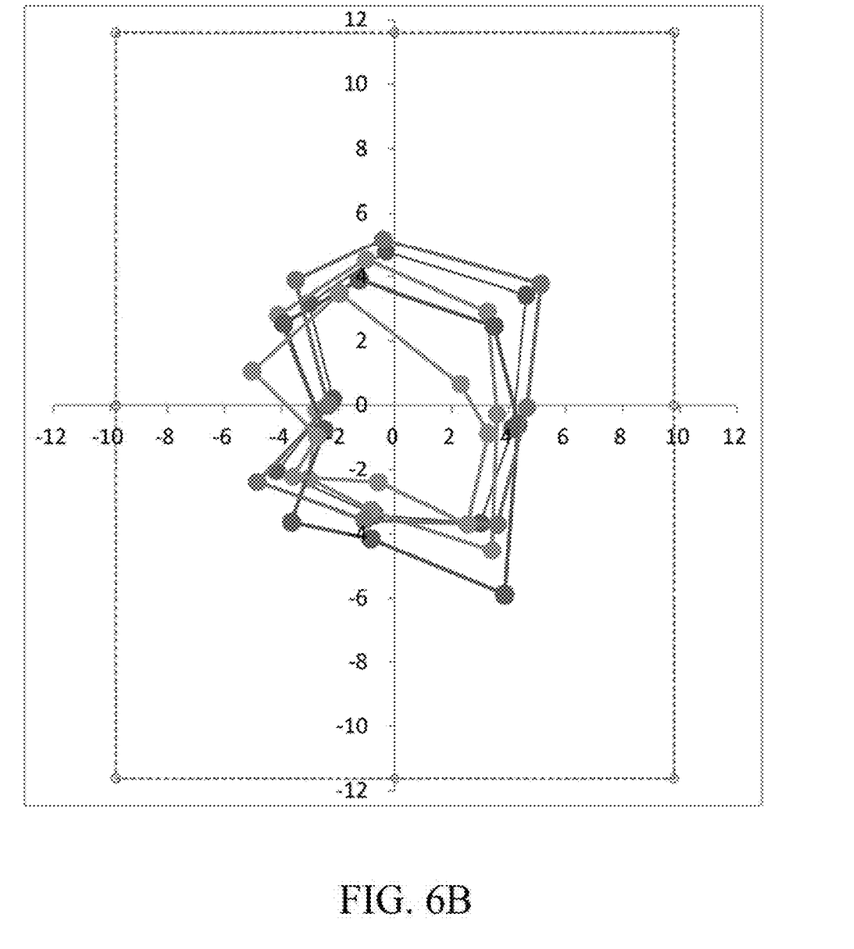

The Gerber artwork is used to form eight corresponding target points on the core samples of the Example and Comparative Examples, each having five samples subject to the testing, and each core sample is subject to five build-up cycles to obtain the multi-layer (twelve-layer) printed circuit board 1 as shown in FIG. 2, which mainly comprises a core 10 having a core insulation layer 12 and traces 14 formed on two sides of the core insulation layer 12; a plurality of insulation layers 20 formed by the build-up process and sequentially formed at two sides of the core 10; and a plurality of traces 30 respectively formed between two adjacent insulation layers 20 and on the outmost insulation layers 20. Said twelve-layer printed circuit board 1 can be obtained by any methods already disclosed in the art, and the materials for the core and insulation layers can be obtained from products already sold by Elite Material Co., Ltd., wherein the cores used in the Example and Comparative Examples contain glass fiber clothes as the substrates, and the core insulation layers are characterized by having the following material properties listed in Table 1.

TABLE 1

|  | Ex. 1 | Comp. Ex. 2 | Comp. Ex. 1 | Comp. Ex. 3 |
| --- | --- | --- | --- | --- |
| Material of core | High dimensional stability material | Low dielectric material | General FR-4.1 material | Low dimensional stability material |
| Material for insulation layers formed by first to fifth build-up cycles | Low dielectric material | Low dielectric material | Low dielectric material | Low dimensional stability material |

Note:
Other insulation layers in the Example and Comparative Examples contain low dielectric material. The low dimensional stability material has a Dk close to that of the low dielectric material, so the circuit boards of the Example and Comparative Examples have similar signal transmission property.

The core and (build-up) insulation layers in the Example and Comparative Examples use glass fiber clothes as the substrates, and the core insulation layer and other (build-up) insulation layers have the following material properties listed in Table 2.

TABLE 2

|  | High dimensional stability material EM-LX | General FR-4.1 material EM-285 | Low dielectric material EM-355(D) | Low dimensional stability material |
| --- | --- | --- | --- | --- |
| X-axis expansion coefficient (ppm/° C.), measurement temperature less than Tg | 9 | 16 | 12 | 20 |
| Y-axis expansion coefficient (ppm/° C.), measurement temperature less than Tg | 10 | 18 | 14 | 22 |
| Z-axis expansion coefficient (ppm/° C.), measurement temperature less than Tg | 25 | 50 | 40 | 60 |
| Dielectric constant Dk (resin content 75%, measured at 2 GHz) | 3.45 | 3.80 | 3.33 | 3.50 |
| Storage modulus (MPa, DMA, (@250° C.) 2116*5 | 12000 | 3300 | 3000 | 3000 |
| Stiffness (N/m, DMA, @250° C.) 2116*5 | 13000 | 4500 | 4100 | 2600 |
| Storage modulus (MPa, DMA, @250° C.) 1067*9 | 11500 | 3000 | 2700 | — |
| Stiffness (N/m, DMA, (@250° C.) 1067*9 | 12500 | 1200 | 1000 | — |
| Tg (° C., DMA) | 280 | 170 | 175 | 180 |

Among the above-listed board properties, X-axis and Y-axis expansion coefficient (also known as α 1, ppm/° C. or μm/° C.) is measured by TMA from a copper-free laminate made by a single prepreg obtained by impregnating a 1078 glass fiber cloth with a resin composition and baking to the semi-cured state, and the measurement is undertaken at a temperature lower than Tg (such as lower than 150° C.); Z-axis expansion coefficient (also known as a 1, ppm/° C. or μm/° C.) is measured by TMA from a copper-free laminate made by four prepregs obtained by impregnating 2116 glass fiber clothes with a resin composition and baking to the semi-cured state, and the measurement is undertaken at a temperature lower than Tg (such as lower than 110° C.); dielectric constant Dk is measured by a cavity resonator (according to the JIS C2565 testing procedure) from a copper-free laminate made by two prepregs obtained by impregnating 1067 glass fiber clothes with a resin composition and baking to the semi-cured state; storage modulus is measured by DMA at 250° C. from two copper-free laminates (made by removing through etching the surface copper foil of laminated copper-clad laminates) made by two different prepregs formed by laminating five 2116 glass fiber clothes (2116*5) and nine 1067 glass fiber clothes (1067*9); stiffness is measured by DMA at 250° C. from two copper-free laminates made by laminating two different prepregs formed by five 2116 glass fiber clothes (2116*5) and nine 1067 glass fiber clothes (1067*9); and glass transition temperature (Tg) is measured by DMA from a copper-free laminate made by laminating prepregs formed by five 2116 glass fiber clothes.

For the Example and Comparative Examples, target point shift after each lamination (build-up) for each sample is measured, and the vertical and horizontal deformations of the boards are calculated as below to evaluate the dimensional stability.

The distance between target points B and H is defined as D1; the distance between target points C and G is defined as D2; and the distance between target points D and F is defined as D3. The vertical deformation of each sample is defined as $Y_{deformation}=[Max(D1,D2,D3)-Min(D1,D2,D3)]$, and the average (micrometer) of five samples is calculated.

The distance between target points B and D is defined as D4; the distance between target points A and E is defined as D5; and the distance between target points H and F is defined as D6. The horizontal deformation of each sample is defined as $X_{deformation}=[Max(D4,D5,D6)-Min(D4,D5,D6)]$, and the average (micrometer) of five samples is calculated.

The structural change of the boards of the Example and each Comparative Example after first and second build-up (lamination) can be observed from FIGS. 3 to 6 (obtained by 3D imager, sample number n=5), wherein the broken lines represent the connections of target points at the original position; the actual coordinate shift after lamination has been amplified by 1000 times, such that the relative coordinate of shift formed by amplifying the actual coordinate by 1000 times is shown for easy observation. In other words, the shift after lamination is calculated according to the actual X- and Y-axis coordinates, and the shift is multiplied by 1000 and plus the original coordinate to form the relative X- and Y-axis coordinates. For example, target point B of Example 1 after first lamination has actual X-coordinate of −9.79865, so the relative X-coordinate of target point B is −9.8+(−9.79865−(−9.8))*1000=−8.45. Similarly, target point B has actual Y-coordinate of 11.59911, so the relative Y-coordinate of target point B is 11.6+(11.59911−11.6)*1000=10.71. In addition, the $X_{deformation}$ and $Y_{deformation}$ are obtained by substituting the actual X-coordinate and actual Y-coordinate into the formulae of $X_{deformation}$ and $Y_{deformation}$ recited above with or without unit conversion according to the units used. The vertical and horizontal deformation data of target points in Example 1 and Comparative Examples 1-3 of the present invention are listed in Table 3, wherein only the first sample (n=1) is shown to demonstrate the relative X-coordinate, relative Y-coordinate, $X_{deformation}$ and $Y_{deformation}$ after first and second lamination.

TABLE 3

| Example | Target point | Relative X-coordinate (inch) | Relative Y-coordinate (inch) | $X_{deformation}$ (micrometer) | $Y_{deformation}$ (micrometer) |
|---|---|---|---|---|---|
| First lamination of Example 1 (FIG. 3A) | B | −8.45 | 10.71 | 22.247 | 21.556 |
| | C | −0.23 | 10.54 | | |
| | D | 8.39 | 10.31 | | |
| | E | 8.02 | 0 | | |
| | F | 8.65 | −10.37 | | |
| | G | −0.34 | −10.25 | | |
| | H | −8.56 | −10.82 | | |
| | A | −8.32 | 0 | | |
| Second lamination of Example 1 (FIG. 3B) | B | −7.72 | 9.43 | 11.172 | 7.621 |
| | C | −0.47 | 9.32 | | |
| | D | 7.59 | 9.36 | | |
| | E | 7.73 | 0.00 | | |
| | F | 7.64 | −9.21 | | |
| | G | −0.45 | −9.12 | | |
| | H | −7.68 | −9.31 | | |
| | A | −8.03 | 0.00 | | |
| First lamination of Comparative Example 1 (FIG. 4A) | B | −6.94 | 7.26 | 37.720 | 43.806 |
| | C | −0.16 | 8.09 | | |
| | D | 5.89 | 8.45 | | |
| | E | 5.70 | 0.09 | | |
| | F | 6.22 | −7.59 | | |
| | G | −0.54 | −7.30 | | |
| | H | −6.44 | −7.05 | | |
| | A | −5.70 | 0.06 | | |

TABLE 3-continued

| Example | Target point | Relative X-coordinate (inch) | Relative Y-coordinate (inch) | $X_{deformation}$ (micrometer) | $Y_{deformation}$ (micrometer) |
|---|---|---|---|---|---|
| Second lamination of Comparative Example 1 (FIG. 4B) | B | −4.56 | 5.70 | 38.361 | 54.226 |
| | C | 0.18 | 6.30 | | |
| | D | 5.50 | 5.26 | | |
| | E | 5.73 | −0.61 | | |
| | F | 6.38 | −5.63 | | |
| | G | −0.34 | −6.76 | | |
| | H | −5.20 | −5.61 | | |
| | A | −4.84 | −0.84 | | |
| First lamination of Comparative Example 2 (FIG. 5A) | B | −7.74 | 7.78 | 48.727 | 50.739 |
| | C | −1.18 | 8.54 | | |
| | D | 5.65 | 8.41 | | |
| | E | 7.24 | 0.00 | | |
| | F | 7.51 | −9.07 | | |
| | G | −0.66 | −9.15 | | |
| | H | −7.77 | −7.92 | | |
| | A | −7.24 | 0.00 | | |
| Second lamination of Comparative Example 2 (FIG. 5B) | B | −7.06 | 7.04 | 53.382 | 32.750 |
| | C | −1.07 | 7.85 | | |
| | D | 5.06 | 6.21 | | |
| | E | 7.13 | 0.00 | | |
| | F | 6.79 | −7.33 | | |
| | G | −0.43 | −7.07 | | |
| | H | −7.27 | −6.78 | | |
| | A | −7.13 | 0.00 | | |
| First lamination of Comparative Example 3 (FIG. 6A) | B | −4.95 | 5.74 | 47.199 | 71.367 |
| | C | −0.32 | 6.97 | | |
| | D | 5.52 | 4.53 | | |
| | E | 4.51 | 0.32 | | |
| | F | 4.08 | −5.14 | | |
| | G | −0.72 | −5.61 | | |
| | H | −5.14 | −4.69 | | |
| | A | −4.17 | 0.48 | | |
| Second lamination of Comparative Example 3 (FIG. 6B) | B | −3.03 | 3.18 | 32.348 | 72.406 |
| | C | −0.32 | 4.78 | | |
| | D | 4.62 | 3.42 | | |
| | E | 4.12 | −0.71 | | |
| | F | 3.01 | −3.67 | | |
| | G | −0.72 | −3.42 | | |
| | H | −4.18 | −2.05 | | |
| | A | −2.19 | 0.21 | | |

From the structural change shown in FIGS. 3 to 6 and the data listed above, among the Example and Comparative Examples, the following observations can be made. Example 1 uses a multi-layer board having a core made of high dimensional stability material (X- and Y-axis thermal expansion coefficients both less than 10 ppm/° C., storage modulus of core insulation layer greater than or equal to 5000 MPa at 250° C., stiffness of core insulation layer greater than or equal to 5000 N/m at 250° C., and glass transition temperature of core insulation layer greater than or equal to 230° C. as measured by DMA), and the six-layer board obtained after second lamination has better dimensional stability (i.e. no significant expansion or contraction), high superimposition rate of target points for the five samples, low variation, and low deformation for each sample (deformation less than 30 micrometers). Comparative Example 1 has a core made of general FR-4 material (X- and Y-axis thermal expansion coefficients about 16-18 ppm/° C., storage modulus of core insulation layer less than 5000 MPa at 250° C., stiffness of core insulation layer less than 5000 N/m at 250° C., and glass transition temperature of core insulation layer less than 230° C. as measured by DMA), and Comparative Example 2 has a core made of low dielectric constant material (X- and Y-axis thermal expansion coefficients about 12-15 ppm/° C., storage modulus of core insulation layer less than 5000 MPa at 250° C., stiffness of core insulation layer less than 5000 N/m at 250° C., and glass transition temperature of core insulation layer less than 230° C. as measured by DMA). The results of Comparative Examples 1 and 2 show non-uniform expansion and contraction, with low superimposition rate of target points for the five samples, high variation, and high deformation for each sample (deformation greater than 30 micrometers). Comparative Example 3 uses a core made of resin composition with X- and Y-axis thermal expansion coefficients about 20-22 ppm/° C. (storage modulus of core insulation layer less than 5000 MPa at 250° C., stiffness of core insulation layer less than 5000 N/m at 250° C., and glass transition temperature of core insulation layer less than 230° C. as measured by DMA), and the six-layer board obtained after second lamination shows severe deformation, with extremely low superimposition rate of target points for the five samples, extremely high variation, and extremely high deformation for each sample, showing extremely irregular expansion and contraction. The results above indicate that the multi-layer board of Example 1 has better dimensional stability and low variation, while the multi-layer boards of Comparative Examples 1-3 have worse dimensional stability, high variation, and severe deformation for each sample.

The above detailed description is merely illustrative in nature and is not intended to limit the embodiments of the subject matter or the application and uses of such embodiments. As used herein, the term "exemplary" means "serving as an example, instance, or illustration." Any implementation described herein as exemplary is not necessarily to be construed as preferred or advantageous over other implementations.

Moreover, while at least one exemplary embodiment has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and foreseeable equivalents at the time of filing this patent application.

What is claimed is:

1. A multi-layer printed circuit board comprising:
    a core comprising a core insulation layer and traces formed on two sides of the core insulation layer;
    a plurality of insulation layers sequentially formed at two sides of the core; and
    a plurality of trace layers respectively formed between two insulation layers and on the outmost insulation layers;
    wherein the core insulation layer contains a resin material different from that of the insulation layers, such that the core insulation layer has a thermal expansion coefficient superior to that of the insulation layers and a stiffness of greater than or equal to 5000 N/m at 250° C; and
    wherein the insulation layers are formed by lamination and have an X-axis or Y-axis deformation of less than 30 micrometers after lamination.

2. The multi-layer printed circuit board of claim 1, wherein the core insulation layer further has a storage modulus, glass transition temperature or a combination thereof superior to that of the insulation layers.

3. The multi-layer printed circuit board of claim 1, wherein the core insulation layer has an X-axis or Y-axis thermal expansion coefficient of less than or equal to 12 ppm/° C.

4. The multi-layer printed circuit board of claim 3, wherein the core insulation layer has an X-axis or Y-axis thermal expansion coefficient of less than or equal to 10 ppm/° C.

5. The multi-layer printed circuit board of claim 2, wherein the core insulation layer has a glass transition temperature of greater than or equal to 230° C. as measured by dynamic mechanical analysis.

6. The multi-layer printed circuit board of claim 2, wherein the core insulation layer has a storage modulus of greater than or equal to 5000 MPa at 250° C.

7. The multi-layer printed circuit board of claim 1, wherein the core insulation layer has an X-axis or Y-axis thermal expansion coefficient less than that of the insulation layers.

8. The multi-layer printed circuit board of claim 1, wherein the insulation layers have a dielectric constant less than that of the core insulation layer.

9. The multi-layer printed circuit board of claim 1, wherein the core insulation layer has an X-axis or Y-axis thermal expansion coefficient of less than 12 ppm/° C., and the insulation layers have a dielectric constant of less than 3.6.

10. The multi-layer printed circuit board of claim 1, wherein the core insulation layer has a glass transition temperature of greater than the temperature used in a lamination step.

11. A process of making the multi-layer printed circuit board of claim 1, comprising:
    providing a first prepreg;
    superimposing a copper foil on each of two sides of the first prepreg and performing lamination;
    forming traces from the copper foils to form a core comprising a core insulation layer and the traces;
    repeating the following build-up steps according to the number of layers needed: laminating a second prepreg and a copper foil onto each side of the core to make the second prepreg form an insulation layer; performing a drilling process; performing a hole metallization process; and forming traces from the copper foils; and
    performing surface treatment after a number of insulation layers needed has been formed;
    wherein the core insulation layer has a thermal expansion coefficient superior to that of the insulation layers.

12. The process of claim 11, wherein the core insulation layer further has a storage modulus, stiffness, glass transition temperature and a combination thereof superior to that of the insulation layers.

13. A multi-layer primed circuit board comprising:
    a core comprising a core insulation layer and traces formed on two sides of the core insulation layer;
    a plurality of insulation layers sequentially formed at two sides of the core; and
    a plurality of trace layers respectively formed between two insulation layers and on outmost insulation layers;
    wherein the core insulation layer contains a resin material different from that of the insulation layers, such that the core insulation layer has a dimensional stability superior to that of the insulation layers,
    wherein the core insulation layer has a stiffness of greater than or equal to 5000 N/m at 250° C,
    wherein the insulation layers have a dielectric constant less than that of the core insulation layer, and
    wherein the core insulation layer has an X-axis or Y-axis thermal expansion coefficient less than that of the insulation layers.

* * * * *